United States Patent [19]

Bukhman

[11] Patent Number: 4,740,268

[45] Date of Patent: Apr. 26, 1988

[54] MAGNETICALLY ENHANCED PLASMA SYSTEM

[75] Inventor: Yefim Bukhman, Tempe, Ariz.

[73] Assignee: Motorola Inc., Schaumburg, Ill.

[21] Appl. No.: 45,925

[22] Filed: May 4, 1987

[51] Int. Cl.$^4$ .................. B44C 1/22; C03C 15/00; C03C 25/06; C23F 1/02

[52] U.S. Cl. .................. 156/643; 156/646; 156/345; 204/192.32; 204/298

[58] Field of Search .................. 156/643, 646, 345; 204/192.32, 298; 427/38, 39; 118/728, 50.1, 620, 621, 623

[56] References Cited

U.S. PATENT DOCUMENTS

| | | | |
|---|---|---|---|
| 4,498,969 | 2/1985 | Ramachandran | 204/298 |
| 4,526,643 | 7/1985 | Okano et al. | 156/345 |
| 4,572,759 | 2/1986 | Benzing | 156/345 |

OTHER PUBLICATIONS

Chapman, "Triode Systems for Plasma Etching", IBM Tech. Disc. Bull., vol. 21, No. 12, May 1979, pp. 5006–5007.

Hill et al., "Advantages of Magnetron Etching", Solid State Technology, Apr. 1985, pp. 243–246.

Leahy et al., "Magnetically Enhanced Plasma Deposition and Etching", Solid State Technology, Apr. 1987, pp. 99–104.

Mantel et al., "Low Pressure Plasma Etching with Magnetic Confinement", Solid State Technology, Apr. 1985, pp. 263–265.

*Primary Examiner*—William A. Powell
*Attorney, Agent, or Firm*—Raymond J. Warren

[57] ABSTRACT

A magnetically enhanced plasma etch reactor utilizing electromagnets for rotation and translational scans of a linear magnetic field in a reaction chamber to produce a dense and uniform plasma for the etch of a workpiece.

6 Claims, 2 Drawing Sheets

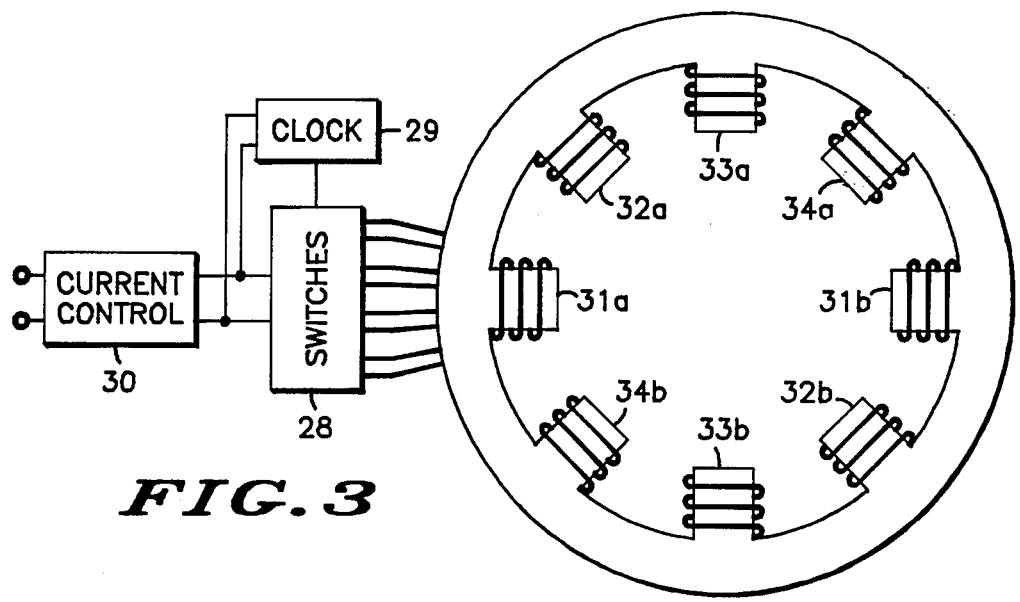
FIG. 3
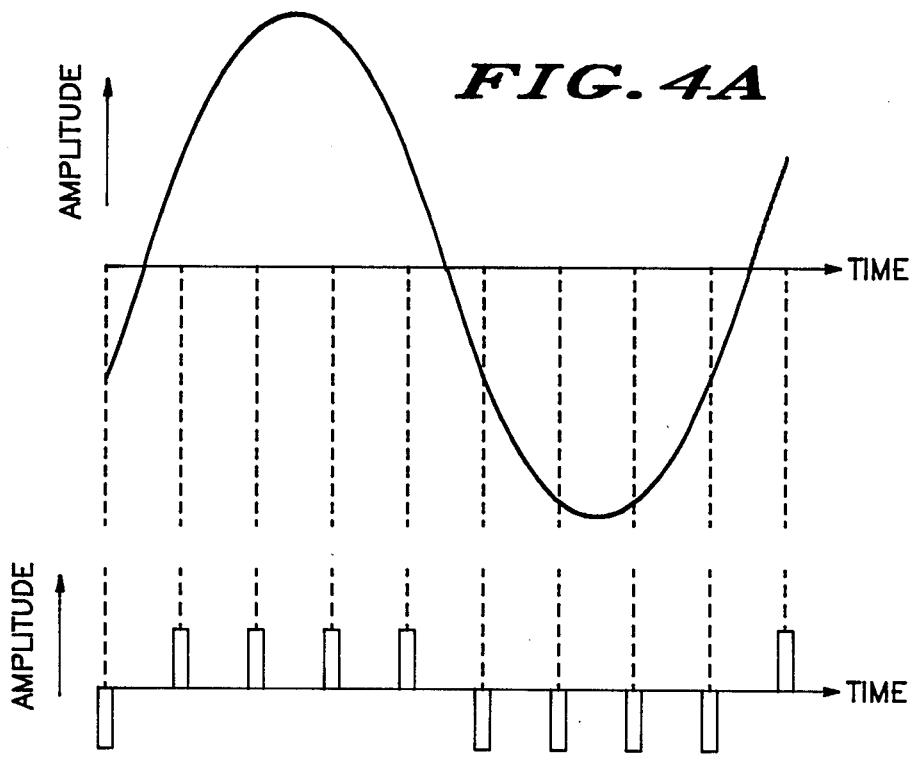
FIG. 4A
FIG. 4B

MAGNETICALLY ENHANCED PLASMA SYSTEM

BACKGROUND

The present invention pertains to a plasma reactor which utilizes electromagnets to enhance plasma.

Plasma etching is a well known dry etching technique which physically and chemically etches a workpiece. The basic plasma reactor consists of an evacuated chamber with electrodes. An etching gas, such as $CF_4$, is introduced into the chamber and is disassociated by the flow of electrons between electrodes, to form a plasma. One of the electrodes, acts as a stage for the workpiece. The workpiece, is then physically and chemically etched by the plasma. The disassociation of the etching gas produces ions with high kinetic energy which bombard the workpiece thereby physically etching it. The disassociation of the etching gas also produces reactive neutrals which react with the workpiece thus chemically etching it.

It has been found that relatively high pressure plasma etchers achieve high etch rates from increased reactive radical densities due to the decreased collisional mean free path of electrons in the discharge. This however, results in an increased degree of isotrophy.

Anisotropic etching can be obtained by decreasing the pressure in the reaction chamber. In this case anisotropy is increased but etch rate is lowered. The lowering of the etch rate is due to the decreased production of reactive radicals due to the increased collisional mean free path of electrons in the discharge.

A low pressure plasma etcher with high etch rates can be obtained by utilizing magnets. A magnetic field perpendicular to the electric field causes electrons to execute a cycloidal motion which continues until the electron suffers an exciting or ionizing collision with a gas molecule producing reactive radicals. While anisotropic etching and increased etch rates are achieved uniformity suffers due to the concentration of reactive radicals along magnetic field lines.

In U.S. Pat. No. 4,526,643 titled "Dry Etching Apparatus Using Reactive Ions", issued July 2, 1985, a dry etching apparatus employing permanent magnets is disclosed. These magnets are attached to a belt which is rotated underneath the workpiece. This causes a scanning motion of the magnetic field across the surface of the workpiece. In bar magnets the magnetic lines connecting north and south poles are curved. The bigger the bar magnet, the less the magnetic lines will be curved. In order to approximate a linear magnetic line, the magnet must be very large. However, even the magnetic lines of large magnets will not become completely linear. Thus, in this prior art with the magnets being necessarily limited in size due to the number, space and mechanics involved, the field is non-linear and results in reduction in uniformity of the etch. Further, the mechanical movement of the magnets themselves is very difficult when located inside a vacuum and can cause numerous problems.

SUMMARY OF THE INVENTION

The present invention pertains to a plasma system with magnetically enhanced plasma. Magnetic fields are produced in the reaction chamber of a plasma reactor device by electromagnetic oils. The magnetic field is then set into motion electrically by exciting the electromagnets in a series fashion.

It is an object of the present invention to provide a new and improved plasma reactor with magnetically enhanced plasma.

It is further object of the present invention to provide a plasma reactor with improved uniformity of plasma etch processes.

It is further object of the present invention to provide a plasma reactor with increased magnetic field control.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 3 is a simplified schematic of an electrical circuit for exciting the device of FIG. 1;

FIG. 4a is a graphical representation of the input to FIG. 3; and

FIG. 4b is a graphical representation of switching signals at various times in FIG. 3.

DESCRIPTION OF THE PREFERRED EMBODIMENT

Figure 1:
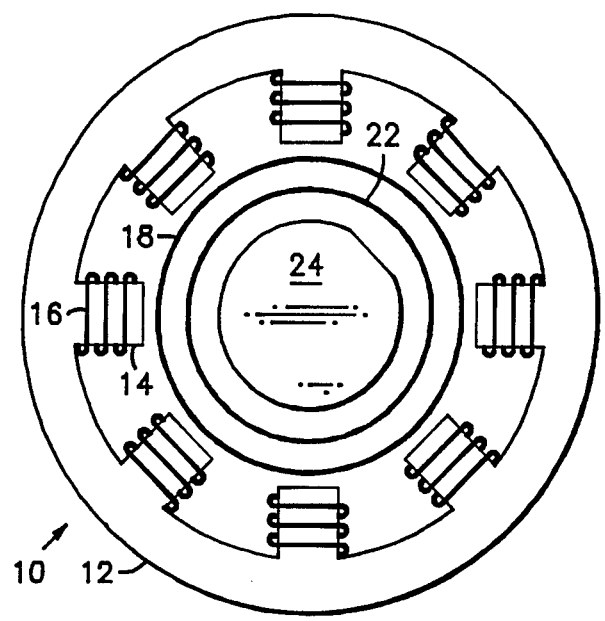
FIG. 1 is a top view of a magnetically enhanced plasma etch system embodying the present invention.

A preferred embodiment of the apparatus in accordance with the invention is illustrated in FIG. 1. A magnetic core 12, which has a plurality of projections 14, encircles a reaction chamber 18. While in this embodiment a solid core is used, it should be understood by those skilled in the art that an air core is possible. Projections 14, in this embodiment, occur in pairs with each member directly opposite the other. Projections 14 are each encircled by a magnetic oil 16. When electric current is passed through these coils, they generate a magnetic field (B). In this embodiment, each member in the pair of projections acts as a magnetic pole, with one being north and the opposing member being south. This acts to produce a magnetic field with magnetic lines that connect the two poles and pass directly through reaction chamber 18 in a straight line.

Figure 2:
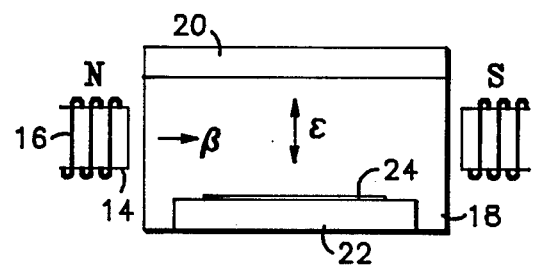
FIG. 2 is a simplified cut-away side view of the device in FIG. 1.

FIG. 2 is a simplified cut-away side view of device 10. Magnetic core 12 and coil 16 can be seen surrounding the reaction chamber 18. The reaction chamber 18 volume has a top electrode 20 and a bottom electrode 22 in this embodiment. Electrode 22 acts as a pallet for a workpiece 24. In FIG. 2, the magnetic core 14 and coil 16 shown are a pair with one being north and the other being south. When an electric current runs through coil 16 a magnetic field is produced between the two poles. This field goes directly across reaction chamber 18 and is perpendicular to the electric field produced by electrodes 20 and 22. This causes the increased ionization of the etching gas due to the increased path of the ionizing electrons.

In order to form a uniform plasma and thereby uniformly etch a workpiece the magnetic field must be perpendicular to the electric field and evenly distributed throughout the reaction chamber 18. This is accomplished by using electromagnets which produce straight magnetic field lines thereby being perpendicular to the electric field at all points, and by the electrical rotation of the magnetic field which evenly distribute the magnetic field lines throughout the reaction chamber.

The rotation of the magnetic field can be accomplished in many ways. A convenient embodiment for the rotation of the magnetic field is illustrated as a simplified schematic in FIG. 3. An AC signal such as 60 Hz is inputted to a switching circuit 28 and clock device 29. In this embodiment four pairs of electromagnetic poles 31A and 31B through 34A and 34B are utilized. Each pair of poles is energized singly. Poles 31A, 32a, 33A and 34A each have coils which are wound in the same direction while their respective pairs are wound in the opposite direction. This causes, when a pair is energized, one pole such as 31A to be north and its pair 31B to be south. The field is rotated by energizing first one pair then energizing the next pair and so on around the reactor with the proceeding pair being denergized and the adjacent pair being energized. For the magnetic field to accomplish a complete rotation, when 180 degrees of rotation has been reached, poles 31B through 34B which had been south must now be north with the opposing member of the pairs changing to south.

FIG. 4A shows a graphical representation of the input to FIG. 3. It shows the positive half and the negative half of an alternating current. FIG. 4B shows a graphical representation of the switching signals with relation to FIG. 4A. As shown by FIG. 4B the current is switched four times in the positive half and four times in negative half of the signal. This causes the full rotation of the magnetic field. A first pair of poles is energized by the first switch with the positive half of the signal and then the current is switched to the second half of poles and so on until the field has rotated 180 degrees and each pair of poles has received a positive signal. The current then alternates to negative and the poles are again energized consecutively with opposite effect. With this negative signal, the poles that are south now become north and the poles that were north now become south. As the current once more switches from air 31 to pair 32 and so on, the magnetic filed completes its 360 degree rotation in the reaction chamber.

The circuitry of FIG. 3 produces a complete revolution of the magnetic field for each cycle of current applied to the input. Thus, the magnetic field is rotating at 60 cycles per second. It will of course, be understood by the skilled in the art that higher or lower frequencies can be utilized to obtain faster or slower rotation of the magnetic field.

There is thus provided by the present invention a substantially improved plasma reactor which, due to the linear magnetic lines and the rotation of said lines, causes a uniform magnetic field throughout the reaction chamber and produces a substantially more uniform etch. Also, due to the electrical control of the magnetic fields, the intensity as well as the speed of rotation of the magnetic field can be controlled with greater precision.

A current intensity control 30 is connected between the current input and switching circuit 28 and is adjustable to control the amount of current being applied to the coils of pole pairs 31-34. Control 30 may be, for example, a simple reostate or potentiometer. By controlling the amount of current being applied to the coils, the intensity of the magnetic field can be controlled and, hence, the density of the plasma.

Having thus described the invention, it will be apparent to those skilled in the art that various modifications can be made within the spirit and scope of the present invention. For example, while in the preferred embodiment a rotational magnetic field is described, a translation magnetic field utilizing electromagnets to sweep a magnetic field over a workpiece or a series of workpieces is possible. Further, while substrate etching has been used in describing this invention, it can also be used for sputtering and plasma enhanced chemical vapor deposition (PECVD) of substrates.

I claim:

1. A magnetically enhanced plasma reactor comprising:
    a reaction chamber;
    a plurality of electromagnets located outside said reaction chamber and forming a linear magnetic field inside said reaction chamber; and
    means for applying a current to said plurality of electromagnets and controlling the current, for movement of said linear magnetic field within said reaction chamber.

2. The magnetically enhanced plasma reactor as claimed in claim 1 wherein said means for applying a current includes means for changing the current to said plurality of electromagnets for controlling a magnetic field intensity.

3. A magnetically enhanced plasma reactor comprising:
    a reaction chamber;
    a plurality of paired electrically conductive coils, wherein each coil in each pair of said plurality of paired electrically conductive coils acts as an opposite magnetic pole;
    a power source energizing each pair of said plurality of paired electrically conductive coils in a consecutive sequence thereby electrically moving a linear magnetic field; and
    each coil of each pair of said plurality of paired electrically conductive coils being placed so that said linear magnetic field between each coil of a pair of said plurality of paired electrically conductive coils passes through the reaction chamber.

4. The magnetically enhanced plasma reactor as claimed in claim 3 wherein each pair of said plurality of paired electrically conductive coils is oppositely wound.

5. The magnetically enhanced plasma reactor as claimed in claim 3 wherein the moving linear magnetic field rotates inside the reaction chamber.

6. A method employing magnetically enhanced plasma for processing a workpiece comprising the steps of:
    providing a reaction chamber;
    providing a plurality of paired coils outside said reaction chamber;
    placing said workpiece in said reaction chamber; and
    creating a moving linear magnetic field by energizing said paired coils in a consecutive sequence.

* * * * *